(12) United States Patent
Kakinuma et al.

(10) Patent No.: US 11,135,828 B2
(45) Date of Patent: Oct. 5, 2021

(54) PROTECTIVE MEMBER FORMING APPARATUS

(71) Applicant: DISCO CORPORATION, Tokyo (JP)

(72) Inventors: Yoshinori Kakinuma, Tokyo (JP); Yoshikuni Migiyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/944,430

(22) Filed: Jul. 31, 2020

(65) Prior Publication Data

US 2021/0039376 A1 Feb. 11, 2021

(30) Foreign Application Priority Data

Aug. 7, 2019 (JP) .............................. JP2019-145351

(51) Int. Cl.
*B32B 41/00* (2006.01)
*G02B 1/14* (2015.01)
(Continued)

(52) U.S. Cl.
CPC ............ *B32B 41/00* (2013.01); *B32B 37/065* (2013.01); *B32B 37/1027* (2013.01); *G02B 1/14* (2015.01); *B32B 2041/04* (2013.01); *B32B 2310/0831* (2013.01); *B32B 2457/20* (2013.01); *G06F 1/1609* (2013.01)

(58) Field of Classification Search
CPC ... B32B 41/00; B32B 2041/04; B32B 37/065; B32B 37/0007; B32B 37/003; B32B 37/1027; B32B 37/0038; B32B 2310/0831; B29C 65/1406; B29C 65/1606; B29C 65/1435; B29C 65/4845; B29C 66/81267; B29C 66/961; B29C 66/97; B29C 66/972; B29C 66/98; B29C 66/345; H01L 2221/68327; H01L 2221/6834; H01L 21/78; H01L 21/304; H01L 21/568; H01L 21/6835; H01L 21/6836; H01L 21/67132; H01L 21/67253; H01L 21/6715;
(Continued)

(56) References Cited

U.S. PATENT DOCUMENTS

| 2008/0129303 A1* | 6/2008 | Takeuchi | ............. B23K 20/002 324/501 |
| 2013/0064967 A1* | 3/2013 | Feinstein | ................ H01L 24/00 427/8 |
| 2016/0214364 A1* | 7/2016 | Yamashita | ........ G02F 1/133308 |

FOREIGN PATENT DOCUMENTS

JP  2017050536 A      3/2017
KR  20140125296 A  * 10/2014

OTHER PUBLICATIONS

Machine translation of KR 20140125296 date unknown.*

* cited by examiner

*Primary Examiner* — John L Goff, II
(74) *Attorney, Agent, or Firm* — Greer Burns & Crain Ltd.

(57) ABSTRACT

A protective member forming apparatus for forming a protective member on the top surface of a substrate by laminating a liquid resin and a cover sheet on a resin film includes: a liquid resin supply unit configured to supply the liquid resin onto the resin film; a pressing unit including a pressing surface, the pressing unit being configured to spread the liquid resin over the resin film by pressing the liquid resin by the pressing surface via the cover sheet; and a determining unit configured to determine the state of the spread liquid resin. The determining unit includes a determining section configured to determine whether or not the liquid resin is spread over a predetermined range with respect to the substrate.

4 Claims, 11 Drawing Sheets

(51) Int. Cl.
*B32B 37/10* (2006.01)
*B32B 37/06* (2006.01)
*G06F 1/16* (2006.01)

(58) Field of Classification Search
CPC ..... H01L 22/12; H01L 24/00; B81C 1/00825; B81C 1/00896
USPC ................................................ 156/64, 275.5
See application file for complete search history.

ic apparatus such as a mobile telephone or a computer are formed by grinding and thinning a substrate having a plurality of devices arranged thereon side by side from an undersurface side, thereby dividing the substrate into each device. The grinding of the substrate is performed by a grinding apparatus. The grinding apparatus holds the substrate on a chuck table in a state in which the undersurface side of the substrate is exposed upward, and grinds the substrate by bringing a grinding stone moving in an annular orbit into contact with the undersurface side of the substrate. In order to protect the top surface side of the substrate at this time, a protective member in which a base material layer and a glue layer are laminated is affixed to the top surface of the substrate in advance.

PROTECTIVE MEMBER FORMING APPARATUS

BACKGROUND OF THE INVENTION

Field of the Invention

The present invention relates to a protective member forming apparatus that form a protective member on the top surface of a substrate having projections and depressions on the top surface.

Description of the Related Art

Device chips used in an electronic apparatus such as a mobile telephone or a computer are formed by grinding and thinning a substrate having a plurality of devices arranged thereon side by side from an undersurface side, thereby dividing the substrate into each device. The grinding of the substrate is performed by a grinding apparatus. The grinding apparatus holds the substrate on a chuck table in a state in which the undersurface side of the substrate is exposed upward, and grinds the substrate by bringing a grinding stone moving in an annular orbit into contact with the undersurface side of the substrate. In order to protect the top surface side of the substrate at this time, a protective member in which a base material layer and a glue layer are laminated is affixed to the top surface of the substrate in advance.

The top surface side of the substrate is provided with devices, patterns constituting wiring, and the like. In addition, bumps serving as electrodes of the devices may be formed on the top surface side of the substrate in advance. Therefore, the various kinds of patterns, the bumps, and the like form projections and depressions on the top surface of the substrate. When the projections and depressions of the top surface of the substrate have a large height difference, the glue layer of the protective member does not sufficiently accommodate the projections and depressions, so that the fixation of the protective member becomes unstable. In addition, a surface on the base material layer side of the protective member does not become flat, so that the chuck table of the grinding apparatus does not uniformly support the substrate. Thus, the undersurface of the substrate does not become flat when the substrate is ground.

Further, a peripheral surplus region in which the devices are not formed on an outer circumferential portion of the substrate does not have patterns or bumps formed therein and is lower than a device formation region in which the devices are formed. Thus, the protective member cannot be sufficiently affixed to the outer circumferential portion of the substrate. Chipping therefore tends to occur at the outer circumference of the substrate when the substrate is ground. A protective member including a thick glue layer to be able to sufficiently accommodate the projections and depressions of the top surface of the substrate may be used. In this case, a residue of the glue layer tends to remain on the projections and depressions when the protective member is peeled off the substrate and becomes a cause of a defect in the device chips.

Accordingly, a protective member has been developed which is formed by supplying a liquid resin onto a cover sheet, placing the substrate on the cover sheet in a state in which the top surface side of the substrate is directed downward, pressing the substrate from above and thus making the liquid resin enter the projections and depressions of the substrate, and curing the liquid resin (see Japanese Patent Laid-Open No. 2017-50536, for example). When the protective member is formed on the top surface of the substrate, a film is disposed on the top surface of the substrate in advance. At this time, the film is adhered to the top surface of the substrate so as to conform to the projections and depressions of the top surface of the substrate. Incidentally, the film does not have the glue layer formed in at least a region adhering to the device formation region of the substrate, so that the glue layer is not in contact with the device formation region of the substrate. Here, when a film larger than the top surface of the substrate is used, at a time that the liquid resin spread toward the outside of the top surface of the substrate reaches the outside of the substrate, the liquid resin is held down by the film, so that the liquid resin does not go around to the undersurface side of the substrate. The formed protective member includes the film, the cured liquid resin, and the cover sheet. A surface on the cover sheet side is flat. When the protective member including the film is then removed from the top surface of the substrate after the substrate is ground, no residue of the liquid resin and the glue layer remains on the projections and depressions of the top surface of the substrate.

SUMMARY OF THE INVENTION

However, when the liquid resin supplied to the film adhering to the top surface of the substrate is pressed and spread, the liquid resin may not be sufficiently spread over a predetermined range. When a protective member is formed by curing the liquid resin in a state in which the liquid resin is not sufficiently spread, the substrate is not properly supported at a time that the substrate is loaded onto the chuck table of the grinding apparatus. A problem consequently occurs because a desired grinding result is not obtained.

It is accordingly an object of the present invention to provide a protective member forming apparatus that can determine whether or not the liquid resin is spread over a predetermined range when the liquid resin is pressed and spread.

In accordance with an aspect of the present invention, there is provided a protective member forming apparatus for forming a protective member on a top surface of a substrate having projections and depressions on the top surface, the protective member being flatter than the projections and depressions on the top surface, by laminating a liquid resin of an ultraviolet curing type and a cover sheet on a resin film adhering to the top surface of the substrate so as to conform to the projections and depressions, the resin film being larger than the substrate, the protective member forming apparatus including: a support table configured to support the substrate having the resin film adhering to the top surface; a liquid resin supply unit configured to supply the liquid resin onto the resin film adhering to the substrate supported on the support table; a pressing unit including a pressing surface capable of holding the cover sheet, the pressing surface being flat and having a light transmitting property, the pressing unit being configured to spread the liquid resin over the resin film by pressing the liquid resin supplied onto the resin film by the pressing surface via the cover sheet held by the pressing surface; an ultraviolet irradiating unit configured to cure the liquid resin by irradiating the liquid resin with ultraviolet rays through the pressing surface and the cover sheet and form the protective member including the resin film, the cured liquid resin, and the cover sheet; and a determining unit configured to determine a state of the liquid resin spread by the pressing unit, the determining unit including a camera configured to photograph the liquid resin and the substrate from above through the pressing surface of the pressing unit, a determining section configured to detect the liquid resin and the substrate from an image obtained by photographing by the camera and determine whether or not the liquid resin is spread over a predetermined range with respect to the substrate, and a notifying section configured to give a notification regarding a determination result of the determining section.

In addition, according to another aspect of the present invention, there is provided a protective member forming apparatus for forming a protective member on a top surface of a substrate having projections and depressions on the top surface, the protective member being flatter than the projections and depressions on the top surface, by laminating a liquid resin of an ultraviolet curing type and a cover sheet on a resin film adhering to the top surface of the substrate so as to conform to the projections and depressions, the resin film being larger than the substrate, the protective member forming apparatus including: a support table having a supporting surface formed by a light transmitting member, the support table being capable of supporting the cover sheet by the supporting surface; a liquid resin supply unit configured to supply the liquid resin to an upper surface of the cover sheet supported on the support table; a pressing unit configured to press the substrate in a state in which the top surface to which the resin film adheres is directed downward by a flat pressing surface from above such that the resin film adheres to the liquid resin on the cover sheet supported on the support table; an ultraviolet irradiating unit configured to cure the liquid resin by irradiating the liquid resin with ultraviolet rays through the supporting surface of the support table and the cover sheet and form the protective member including the resin film, the cured liquid resin, and the cover sheet; and a determining unit configured to determine a state of the liquid resin spread by the pressing unit; the determining unit including a camera configured to photograph the liquid resin and the substrate from below through the supporting surface of the support table, a determining section configured to detect the substrate and the liquid resin from an image obtained by photographing by the camera and determine whether or not the liquid resin is spread over a predetermined range with respect to the substrate, and a notifying section configured to give a notification regarding a determination result of the determining section.

Preferably, the camera has a fisheye lens or a wide-angle lens disposed so as to be adjacent to the ultraviolet irradiating unit and installed at a position corresponding to a center of the facing substrate, and the photographing is performed by using the fisheye lens or the wide-angle lens.

The protective member forming apparatus according to one aspect of the present invention supplies the liquid resin onto the resin film adhering to the top surface of the substrate, and spreads the liquid resin over the resin film by pressing the liquid resin by the pressing surface of the pressing unit via the cover sheet. At this time, the direction of the pressing surface is set such that the pressing surface is parallel with the undersurface of the substrate, for example. The protective member forming apparatus includes the determining unit including the camera that photographs the liquid resin and the substrate from above through the pressing surface. Alternatively, the protective member forming apparatus according to one aspect of the present invention supplies the liquid resin onto the cover sheet and spreads the liquid resin over the cover sheet by pressing the liquid resin by the substrate to which the resin film adheres via the resin film. The protective member forming apparatus includes the determining unit including the camera that photographs the liquid resin and the substrate from below through the supporting surface of the support table supporting the cover sheet.

When the liquid resin and the substrate are photographed by the camera, whether or not the liquid resin is spread over the predetermined range can be determined. Therefore, in a case where the liquid resin is not sufficiently spread, it can be detected that the liquid resin is not sufficiently spread, and the liquid resin can be spread by further pressing the liquid resin, before the liquid resin is cured. The curing of the liquid resin is performed after it is confirmed that the liquid resin is sufficiently spread. The protective member can therefore be formed on the top surface of the substrate properly.

Hence, according to one aspect of the present invention, a protective member forming apparatus is provided which can determine whether or not a liquid resin is spread over a predetermined range when pressing and spreading the liquid resin.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
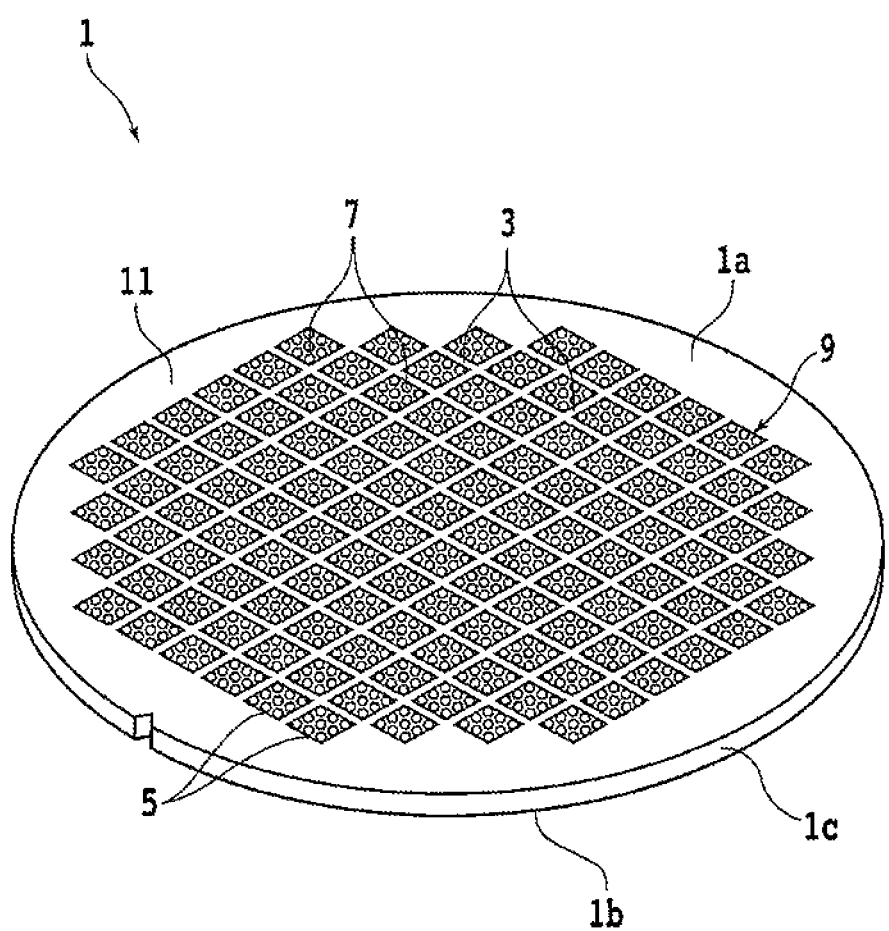
FIG. 1 is a perspective view schematically illustrating a substrate.

An embodiment according to one aspect of the present invention will be described with reference to the accompanying drawings. A protective member forming apparatus according to the present embodiment forms a protective member on the top surface of a substrate such as a semiconductor wafer or the like which substrate has a plurality of devices formed on the top surface thereof. The substrate having the protective member formed on the top surface thereof will first be described. FIG. 1 is a perspective view schematically illustrating a substrate 1. The substrate 1 is, for example, a wafer formed of a material such as silicon (Si), silicon carbide (SiC), gallium nitride (GaN), gallium arsenide (GaAs), or another semiconductor. Alternatively, the substrate 1 is a substantially disk-shaped substrate or the like formed of a material such as sapphire, glass, or quartz. The glass is, for example, alkali glass, non-alkali glass, soda-lime glass, lead glass, borosilicate glass, quartz glass, or the like.

Figure 3A:
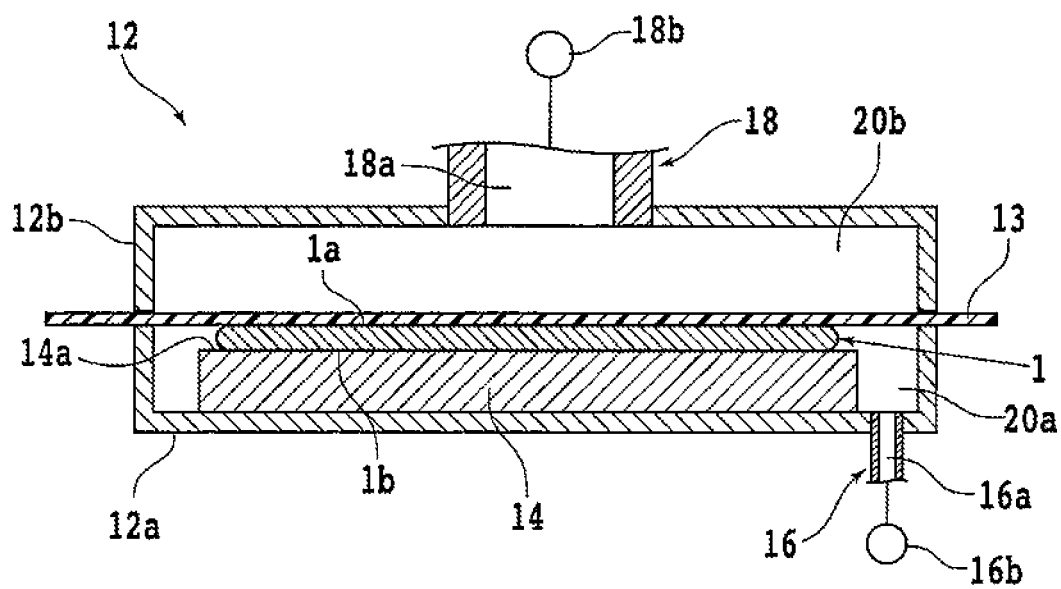
FIG. 3A is a sectional view schematically illustrating a resin film adhering unit.
Figure 3B:
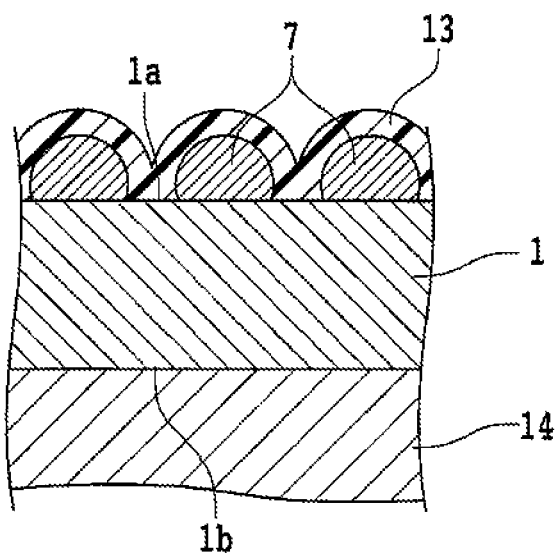
FIG. 3B is a sectional view schematically illustrating, in enlarged dimension, the substrate having a resin film adhering to a top surface thereof.

FIG. 1 schematically illustrates a perspective view of the substrate 1. FIG. 3A schematically illustrates a sectional view of the substrate 1. FIG. 3B schematically illustrates an enlarged sectional view of the substrate 1. A plurality of planned dividing lines 3 intersecting each other are set on a top surface 1a of the substrate 1. A device 5 such as an integrated circuit (IC) or large-scale integration (LSI) is formed in each region demarcated by the planned dividing lines 3. Individual device chips can be formed when the substrate 1 is divided along the planned dividing lines 3 by grinding the substrate 1 from an undersurface 1b side and thus thinning the substrate 1. A plurality of projecting portions referred to as bumps 7 formed of a metal are provided on the top surface 1a of the substrate 1. Each of the bumps 7 is electrically connected to the device 5 and functions as an electrode at a time of inputting or outputting an electric signal to the device 5 after the device chips are formed by dividing the substrate 1. The bumps 7 are, for example, formed of a metallic material such as gold, silver, copper, or aluminum. However, the bumps 7 may not necessarily be provided on the top surface 1a of the substrate 1.

A region on an outer circumferential side which region surrounds a region in which the plurality of devices 5 are formed on the top surface 1a of the substrate 1 is referred to as a peripheral surplus region 11. The peripheral surplus region 11 of the top surface 1a of the substrate 1 has no devices 5 formed therein and has no bumps 7 as the electrodes of the devices 5 formed therein either. The region surrounded by the peripheral surplus region 11 of the top surface 1a of the substrate 1 is referred to as a device formation region 9. The device formation region 9 of the top surface 1a of the substrate 1 is not flat and has projections and depressions resulting from each pattern constituting the devices 5 and the bumps 7. On the other hand, the peripheral surplus region 11 of the top surface 1a is flat.

It is to be noted that the substrate 1 on which the protective member is formed is not limited to this. For example, the substrate 1 on which the protective member is formed may be a package substrate formed by sealing a plurality of devices arranged on a flat surface with a sealing resin. Individual device chips having a predetermined thickness which device chips are sealed by the sealing resin can be formed when the package substrate is thinned by grinding the sealing resin on the undersurface side of the package substrate and the package substrate is thus divided on a device-by-device basis. Bumps serving as electrodes of individual devices are formed on the top surface of the package substrate. Thus, the top surface of the package substrate, also, is not flat and has projections and depressions.

When the substrate 1 is thinned by grinding the substrate 1 from the undersurface 1b side by a grinding apparatus and the substrate 1 is thus divided, device chips thinned to a predetermined thickness are obtained. A protective member is affixed to the top surface 1a side in advance in order to protect the top surface 1a side when the substrate 1 is ground from the undersurface 1b side. When the substrate 1 having the protective member affixed to the top surface 1a is carried into the grinding apparatus, the substrate 1 is properly supported on a support table via the protective member.

Figure 2:
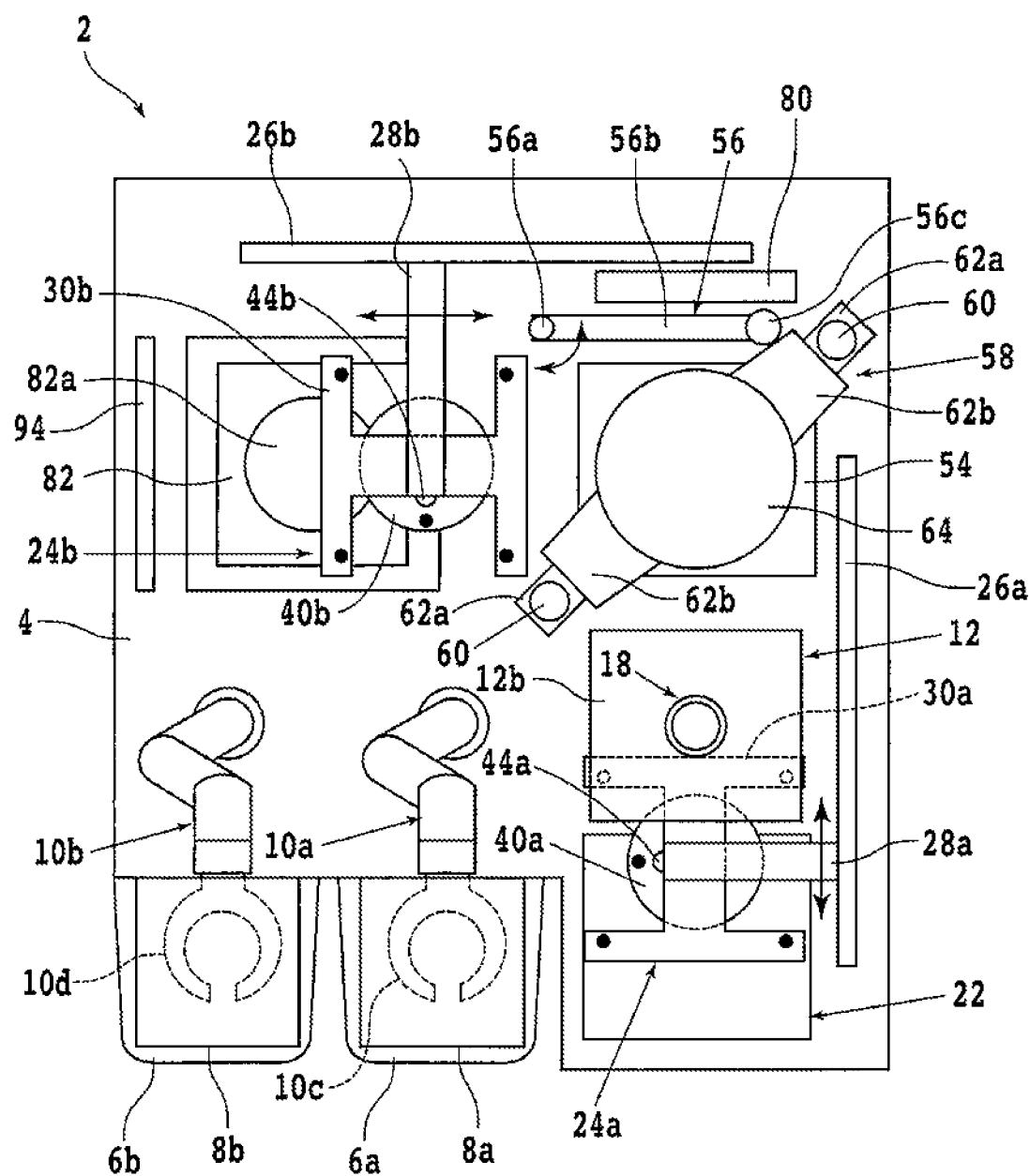
FIG. 2 is a top view schematically illustrating a protective member forming apparatus.

The protective member forming apparatus according to the present embodiment will be described in the following. FIG. 2 is a top view schematically illustrating a protective member forming apparatus 2. The protective member forming apparatus 2 includes a base 4 supporting constituent elements. An end portion of the base 4 is provided with cassette mounting bases 6a and 6b mounted with cassettes 8a and 8b housing a plurality of substrates 1. A substrate 1 before a protective member is formed is, for example, housed in the cassette 8a placed on the cassette mounting base 6a and carried into the protective member forming apparatus 2. Then, the substrate 1 having the protective member formed on the top surface 1a in the protective member forming apparatus 2 is, for example, housed in the cassette 8b placed on the cassette mounting base 6b.

A substrate transfer robot 10a is provided at a position adjacent to the cassette mounting base 6a on the base 4. A substrate transfer robot 10b is provided at a position adjacent to the cassette mounting base 6b. The substrate transfer robots 10a and 10b are, for example, an articulated robot having a plurality of arm portions connected to each other so as to be continuously rotatable on mutual end portions. Substrate holding portions 10c and 10d that can hold a substrate 1 are provided at distal ends of arm portions on a most distal end side. The substrate holding portions 10c and 10d can be moved when the arm portions are rotated with respect to each other. The substrate holding portions 10c and 10d of the substrate transfer robots 10a and 10b are inserted into the cassettes 8a and 8b placed on the cassette mounting bases 6a and 6b and carry substrates 1 into and out of the cassettes 8a and 8b. Here, the substrate transfer robots 10a and 10b include shaft portions erected on the base 4 and supporting the arm portions; and raising and lowering mechanisms that raise and lower the shaft portions. The raising and lowering mechanisms raise and lower the substrate holding portions 10c and 10d together with the shaft portions such that the substrate holding portions 10c and 10d coincide with the height of a cassette housing region into and out of which a substrate 1 is to be carried among a plurality of stacked cassette housing regions included in the cassettes 8a and 8b.

The substrate transfer robot 10a has a function of transferring a substrate 1 housed in the cassette 8a mounted on the cassette mounting base 6a to a resin film adhering unit 12 to be described next. FIG. 3A is a sectional view schematically illustrating an example of the resin film adhering unit 12. The resin film adhering unit 12 is, for example, a unit in the form of a chamber internally having a space capable of housing the substrate 1. The resin film adhering unit 12 has a function of adhering a resin film 13 to the top surface 1a of the substrate 1. Here, the resin film 13 is, for example, a polyolefin-based sheet, a polyethylene-based sheet, or the like, may be a single layer or laminated, and has a thickness equal to or more than 20 µm and equal to or less than 80 µm. The resin film adhering unit 12 has a hollow-shaped lower main body 12a opening upward and a hollow-shaped upper main body 12b disposed over the lower main body 12a and opening downward. The upper main body 12b can be raised and lowered. The opening of the lower main body 12a and the opening of the upper main body 12b are of the same shape. When the upper main body 12b is lowered to the lower main body 12a such that the openings coincide with each other, a space isolated from the outside can be formed within the upper main body 12b and the lower main body 12a. Incidentally, each of the openings is larger than the substrate 1, and the substrate 1 can be housed within the space.

The lower main body 12a is provided with a table-shaped substrate supporting portion 14 supporting the substrate 1. The upper surface of the substrate supporting portion 14 is a flat supporting surface 14a that supports the substrate 1. The height of the substrate supporting portion 14 is adjusted such that the top surface 1a of the substrate 1 and the opening of the lower main body 12a are substantially at the same height when the substrate 1 is placed on the supporting surface 14a. Alternatively, the height of the substrate supporting portion 14 is adjusted such that the opening of the lower main body 12a is higher than the top surface 1a of the substrate 1. In these cases, when the resin film 13 is placed on the lower main body 12a and adhered to the substrate 1 as described later, the resin film 13 does not adhere to the side surface of the substrate 1 unnecessarily widely. An exhaust unit 16 is connected to a bottom wall or a side wall of the lower main body 12a. The exhaust unit 16 includes an exhaust passage 16a having one end connected to the lower main body 12a and having another end connected to a suction source 16b. In addition, an exhaust unit 18 is connected to a ceiling or a side wall of the upper main body 12b. The exhaust unit 18 includes an exhaust passage 18a having one end connected to the upper main body 12b and having another end connected to a suction source 18b.

At a time of adhering the resin film 13 to the top surface 1a of the substrate 1 by using the resin film adhering unit 12, the substrate 1 is loaded onto the substrate supporting portion 14, the substrate supporting portion 14 is made to support the substrate 1, and thereafter, the top surface 1a of the substrate 1 is covered by the resin film 13. A resin film supplying unit 22 in which a plurality of resin films 13 are prepared is provided at a position adjacent to the resin film adhering unit 12 on the base 4 of the protective member forming apparatus 2. A transfer unit 24a to be described later transfers a resin film 13 for covering the substrate 1 from the resin film supplying unit 22. Resin films 13 larger than the opening of the lower main body 12a are prepared in the resin film supplying unit 22 so that a space 20a closed by the lower main body 12a and the resin film 13 can be formed when the resin film 13 is transferred onto the substrate 1. Then, after the resin film 13 is transferred onto the substrate 1, the upper main body 12b is brought into contact with the upper surface of the resin film 13 by lowering the upper main body 12b. Then, a space 20b closed by the upper main body 12b and the resin film 13 is formed.

At this time, when the resin film 13 is adhered to the substrate 1, the inside of the resin film adhering unit 12 in the form of a chamber is divided into the upper space 20b and the lower space 20a by the resin film 13. Then, when the suction source 16b of the exhaust unit 16 is actuated and the suction source 18b of the exhaust unit 18 is actuated, the space 20a and the space 20b can be exhausted and decompressed. Thereafter, only the suction source 18b decompressing the space 20b is stopped, and the space 20b is opened to the atmosphere. As a result, a large pressure difference momentarily occurs between the space 20a and the space 20b with the resin film 13 interposed therebetween. This pressure difference then causes the resin film 13 to adhere to the top surface 1a so as to conform to the projections and depressions of the top surface 1a of the substrate 1. FIG. 3B is a sectional view schematically illustrating, in enlarged dimension, the substrate 1 having the resin film 13 adhering to the top surface 1a. The resin film 13 can be adhered to the top surface 1a of the substrate 1 when the resin film adhering unit 12 is used as described above. After the resin film 13 is adhered to the substrate 1, the exhaust unit 16 is stopped, and the upper main body 12b is raised.

Incidentally, a heating unit not illustrated which can supply a heated gas may be connected to the ceiling or the side wall of the upper main body 12b. The heating unit has a function of supplying the heated gas to the space 20b of the upper main body 12b. The gas is, for example, air, nitrogen gas, or the like. In a case where a material whose flexibility is enhanced by heating is used as the resin film 13, for example, when the heated gas is supplied to the space 20b, the gas increases the temperature of the resin film 13 and thus softens the resin film 13. When the resin film 13 is softened, the resin film 13 is easily deformed so as to follow the shape of the top surface 1a of the substrate 1, and the resin film 13 adheres to the top surface 1a of the substrate 1 easily. For example, before the space 20a and the space 20b are decompressed, the heating unit may supply the heated gas to the space 20b to heat and soften the resin film 13 in advance. Alternatively, the heating unit may be actuated to heat the resin film 13 and promote deformation of the resin film 13 after the space 20a and the space 20b are decompressed and the space 20b is opened to the atmosphere.

The protective member forming apparatus 2 includes a support table 54 at a position adjacent to the resin film adhering unit 12 on the base 4. The transfer unit 24a transfers the substrate 1 to which the resin film 13 adheres from the resin film adhering unit 12 to the support table 54. In an apparatus configuration illustrated in FIG. 2, the resin film supplying unit 22, the resin film adhering unit 12, and the support table 54 are arranged next to each other linearly. The transfer unit 24a has a function of transferring the resin film 13 from the resin film supplying unit 22 to the resin film adhering unit 12. The transfer unit 24a has another function of transferring the substrate 1 to which the resin film 13 adheres from the substrate supporting portion 14 to the support table 54 while the resin film 13 remains in a spread state on the outside of the substrate 1.

Figure 4A:
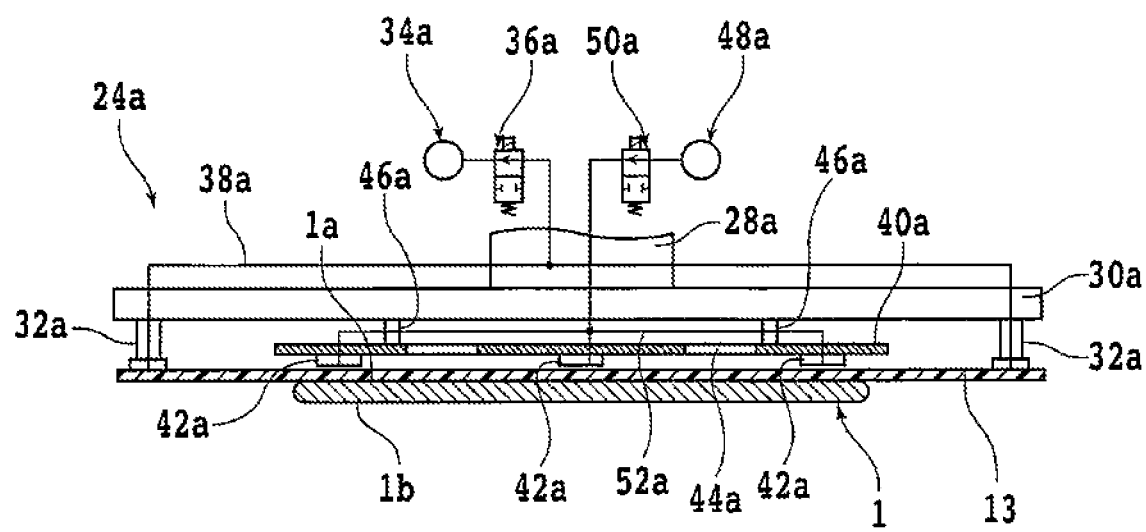
FIG. 4A is a sectional view schematically illustrating the substrate held by a transfer unit.
Figure 4B:
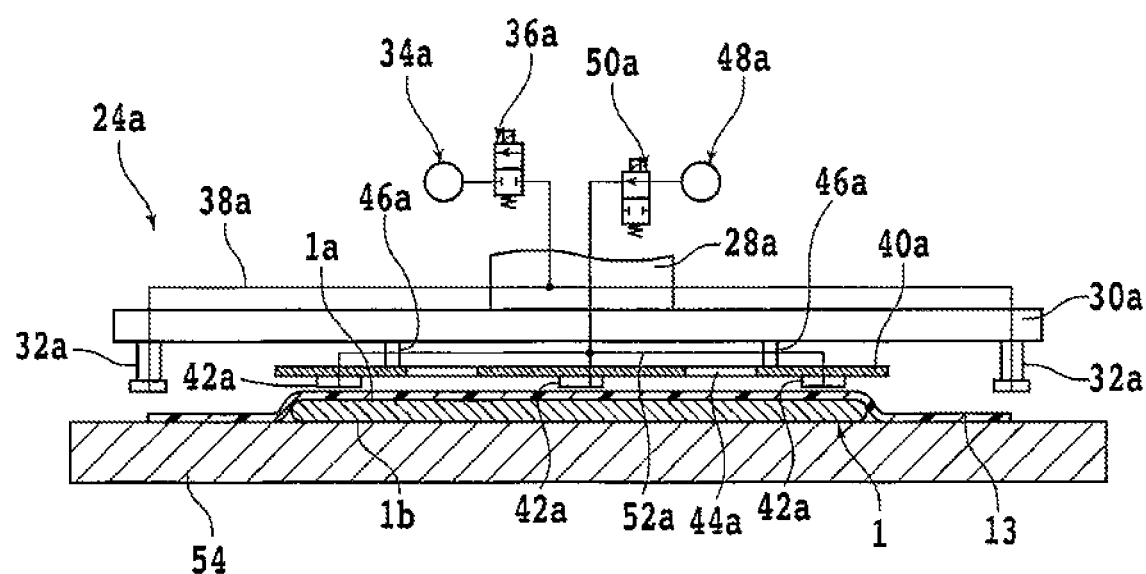
FIG. 4B is a sectional view schematically illustrating a state of having released the sucking and holding of the resin film by suction pads of the transfer unit that has transferred the substrate onto a support table.
Figure 5A:
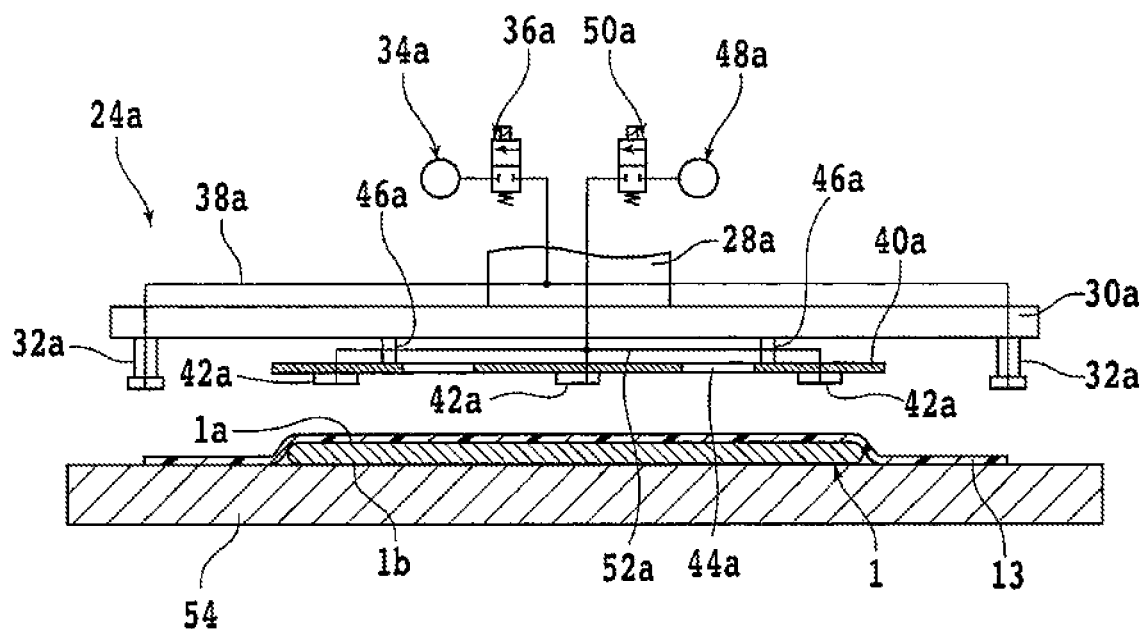
FIG. 5A is a sectional view schematically illustrating a state of having released the sucking and holding of the resin film by noncontact type suction pads of the transfer unit.

FIG. 2 schematically illustrates a top view of the transfer unit 24a. In addition, FIG. 4A, FIG. 4B, and FIG. 5A schematically illustrate side views of the transfer unit 24a. The transfer unit 24a includes a guide rail 26a along a direction in which the resin film adhering unit 12 and the support table 54 are arranged and an arm portion 28a slidably fitted to the guide rail 26a. The transfer unit 24a includes a moving mechanism (not illustrated) that moves the arm portion 28a along the guide rail 26a. The moving mechanism, for example, includes a ball screw (not illustrated) along the guide rail 26a and a pulse motor (not illustrated) that rotates the ball screw. A proximal end side of the arm portion 28a is provided with a nut portion (not illustrated) screwed onto the ball screw. When the ball screw is rotated by the pulse motor, the arm portion 28a moves along the guide rail 26a. A base portion 30a is fixed to a distal end side of the arm portion 28a. The moving mechanism moves the base portion 30a together with the arm portion 28a.

A plate-shaped noncontact type suction pad supporting portion 40a is fixed to the central lower surface of the base portion 30a via a plurality of columnar supporting portions 46a. Sectional views of the noncontact type suction pad supporting portion 40a are illustrated in FIG. 4A and the like. A through hole 44a is formed in the noncontact type suction pad supporting portion 40a. A plurality of noncontact type suction pads 42a are provided to the lower surface of the noncontact type suction pad supporting portion 40a. The plurality of noncontact type suction pads 42a are fixed to the base portion 30a via the noncontact type suction pad supporting portion 40a and the supporting portions 46a. The plurality of noncontact type suction pads 42a are each arranged on the lower surface of the noncontact type suction pad supporting portion 40a so as to be able to face the resin film 13 adhering to the top surface 1a of the substrate 1 in a region superimposed on the substrate 1. In addition, a plurality of suction pads 32a are fixed to the lower surface of an outer circumferential portion of the base portion 30a. The plurality of suction pads 32a are each arranged on the lower surface of the base portion 30a so as to be able to face the resin film 13 on the outside of the substrate 1.

Here, the lower surfaces of the plurality of suction pads 32a are at a uniform height, and the lower surfaces of the plurality of noncontact type suction pads 42a are at a uniform height. The height of the lower surfaces of the suction pads 32a is at a position slightly lower than the height of the lower surfaces of the plurality of noncontact type suction pads 42a. The lower surfaces of the suction pads 32a and the noncontact type suction pads 42a serve as suction surfaces that can suck and hold the resin film 13 adhering to the substrate 1.

The transfer unit 24a includes a suction passage 38a having one end reaching the lower surface of each of the suction pads 32a and having another end connected to a suction source 34a. The suction passage 38a is provided with a switching unit 36a. The switching unit 36a has a function of switching between a blocking state and a ventilating state in the suction passage 38a. When the switching unit 36a is set in the ventilating state, the suction source 34a acts to generate a negative pressure in the lower surfaces of the suction pads 32a. In addition, the transfer unit 24a includes an air supply passage 52a having one end reaching the lower surface of each of the noncontact type suction pads 42a and having another end connected to an air supply source 48a. The air supply passage 52a is provided with a switching unit 50a. The switching unit 50a has a function of switching between a blocking state and a ventilating state in the air supply passage 52a. When the switching unit 50a is set in the ventilating state, the air supply source 48a acts to jet gas from the lower surfaces of the noncontact type suction pads 42a.

Here, the lower surfaces of the noncontact type suction pads 42a are provided with a plurality of jetting ports not illustrated. The gas supplied to the noncontact type suction pads 42a through the air supply passage 52a is jetted from the jetting ports. The jetting ports are not directed in a completely downward direction but are directed in directions inclined from the completely downward direction to the outsides of the respective noncontact type suction pads 42a. The gas is jetted in the directions from the jetting ports. When a suction target object is positioned below the noncontact type suction pads 42a with a slight gap made therebetween and the gas is jetted from each of the jetting ports by setting the switching unit 50a in the ventilating state, the jetted gas travels toward the outsides of the noncontact type suction pads 42a. Then, a part of the gas escapes upward through the through hole 44a of the noncontact type suction pad supporting portion 40a. The gas jetted from the jetting ports of the noncontact type suction pads 42a travels while entraining surrounding air. Thus, a negative pressure occurs at central lower portions of the noncontact type suction pads 42a. The suction target is sucked and held by the noncontact type suction pads 42a due to the negative pressure. However, at this time, the noncontact type suction pads 42a are not in contact with the suction target.

In a case where a contact type suction pad is used in place of the noncontact type suction pads 42a, for example, the suction pad and the resin film 13 come into contact with each other. In this case, there is a fear that a contact trace of the suction pad is formed on the upper surface of the resin film 13, or there is a fear that particulates or the like as a contamination source adhering to the lower surface of the suction pad may be transferred to the resin film 13, so that appropriate formation of the protective member may be hindered. In addition, the upper surface of the resin film 13 adhering to the top surface 1a of the substrate 1 has an uneven shape. Thus, even when the contact type suction pad is brought into contact with the resin film 13, gaps resulting from the uneven shape occur between the suction pad and the resin film 13, and the negative pressure leaks. The contact type suction pad is therefore unable to suck and hold the resin film 13 properly. In contrast, such problems do not occur in the case where the noncontact type suction pads 42a suck and hold the resin film 13 adhering to the substrate 1. On the other hand, the protective member does not need to be formed with high accuracy on the outside of the substrate 1. The suction pads 32a sucking and holding the outer circumferential portion of the resin film 13 may therefore be of the noncontact type or the contact type.

When the transfer unit 24a transfers the substrate 1 to which the resin film 13 adheres from the substrate supporting portion 14 to the support table 54, the upper main body 12b of the resin film adhering unit 12 is raised, and the base portion 30a is moved to a position above the substrate supporting portion 14. Here, the transfer unit 24a includes a raising and lowering mechanism not illustrated which raises and lowers the base portion 30a. Next, the raising and lowering mechanism is actuated to lower the base portion 30a toward the substrate 1 supported by the substrate supporting portion 14. The base portion 30a is then positioned at a height such that the lower surfaces of the suction pads 32a are in contact with the resin film 13 and such that the noncontact type suction pads 42a can suck the resin film 13. The switching units 36a and 50a are thereafter actuated to suck the outer circumferential portion of the resin film 13 by the suction pads 32a and suck the substrate 1 by the noncontact type suction pads 42a via the resin film 13. The raising and lowering mechanism is then actuated to lift the substrate 1 by the transfer unit 24a.

The moving mechanism of the transfer unit 24a is thereafter actuated to move the base portion 30a to a position above the support table 54. FIG. 4A is a sectional view schematically illustrating a state in which the substrate 1 is being transferred by the transfer unit 24a. After the base portion 30a is moved to the position above the support table 54, the raising and lowering mechanism is actuated to place the substrate 1 on the support table 54. Thereafter, first, only the switching unit 36a is actuated and set in the blocking state, so that the suction of the resin film 13 by the suction pads 32a is released.

FIG. 4B is a sectional view schematically illustrating the transfer unit 24a and the substrate 1 in a state in which the suction of the resin film 13 by the suction pads 32a is released. When the suction of the resin film 13 by the suction pads 32a is released, the resin film 13 falls to the upper surface of the support table 54. At this time, the gas continues to be ejected from the noncontact type suction pads 42a, and the gas travels over the upper surface of the resin film 13 to the outside of the support table 54. Therefore, when the suction of the resin film 13 by the suction pads 32a is released, a force directed in an outward direction is applied to the resin film 13 due to the flow of the gas. When the resin film 13 is bent or wrinkled in a part not adhering to the substrate 1, for example, the flow of the gas straightens the resin film 13 and removes the bend or the wrinkle. When the suction of the resin film 13 by the noncontact type suction pads 42a is thereafter released, the substrate 1 is placed on the support table 54 in a state in which the resin film 13 is spread.

The suction by all of the pads may be released simultaneously in order to complete the transfer of the resin film 13 quickly, for example. However, even when the resin film 13 is bent or wrinkled at a time of releasing the suction of the resin film 13 in this case, the flow of the gas is stopped, and therefore, the bend or the like is not removed. When the substrate 1 is placed on the support table 54 in a state in which the resin film 13 is bent or wrinkled, there is a fear of being unable to normally perform steps to be performed subsequently and being unable to form the protective member on the top surface 1a of the substrate 1 properly. On the other hand, the transfer unit 24a of the protective member forming apparatus 2 according to the present embodiment allows each of the suction pads 32a and the noncontact type suction pads 42a to be actuated independently. The suction of the resin film 13 by each pad can therefore be sequentially released with a time lag provided. Hence, it is possible to suppress the occurrence of a bend or a wrinkle in the resin film 13 when transferring the substrate 1 to the support table 54 and suppress defective formation of the protective member due to the bend or the wrinkle in the resin film 13.

FIG. 5A is a sectional view schematically illustrating a state in which the sucking and holding of the substrate 1 by the transfer unit 24a is released and the base portion 30a is raised by the raising and lowering mechanism. A liquid resin is supplied to the top surface 1a side of the substrate 1 on the support table 54 with the resin film 13 interposed between the liquid resin and the top surface 1a side of the substrate 1, the liquid resin is spread over the resin film 13 by being pressed from above, and the liquid resin is cured.

Figure 5B:
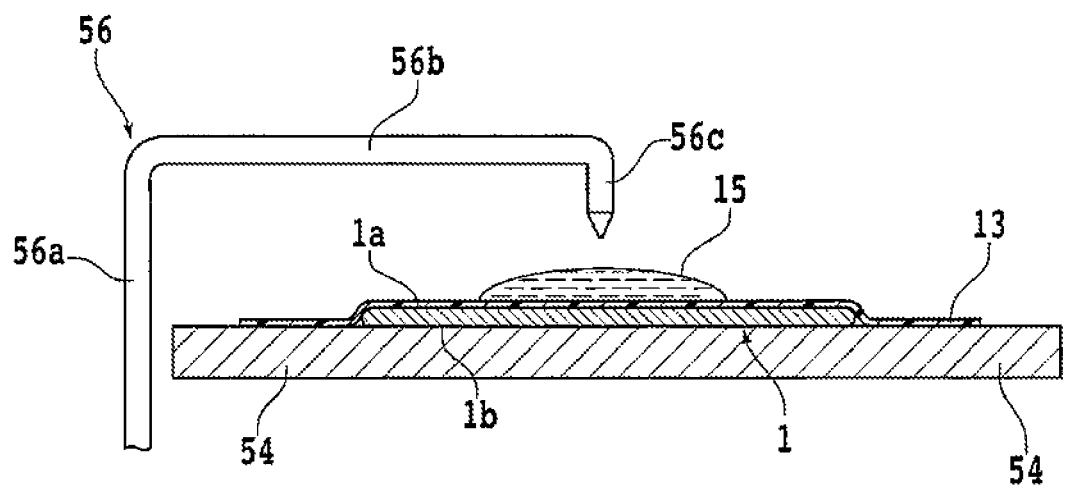
FIG. 5B is a sectional view schematically illustrating the substrate with a liquid resin supplied to the upper surface of the resin film.

A liquid resin supply unit 56 is provided at a position adjacent to the support table 54 on the base 4 of the protective member forming apparatus 2. The liquid resin supply unit 56 is a pipe-shaped unit including a shaft portion 56a extending along a vertical direction, an arm portion 56b extending in a horizontal direction from an upper end of the shaft portion 56a, and a nozzle 56c oriented downward from a distal end of the arm portion 56b. The shaft portion 56a is rotatable in the vertical direction. When the shaft portion 56a is rotated, the nozzle 56c moves in an arcuate orbit with the arm portion 56b as a radius. The length of the arm portion 56b is set to a length such that the nozzle 56c can be positioned above the center of the support table 54 by rotating the shaft portion 56a. The liquid resin supply unit 56 has a function of supplying a liquid resin of an ultraviolet curing type onto the substrate 1 placed on the support table 54 through the shaft portion 56a, the arm portion 56b, and the nozzle 56c. The liquid resin of the ultraviolet curing type is a liquid resin cured by being irradiated with ultraviolet rays. FIG. 5B schematically illustrates a sectional view of the liquid resin supplied onto the resin film 13 adhering to the substrate 1.

When a liquid resin 15 is supplied to the upper surface of the resin film 13, the nozzle 56c is positioned above the center of the support table 54 by rotating the shaft portion 56a. Then, after the liquid resin 15 is supplied to the top surface 1a of the substrate 1, the nozzle 56c is positioned at a position not overlapping the support table 54 by rotating the shaft portion 56a again.

Figure 6:
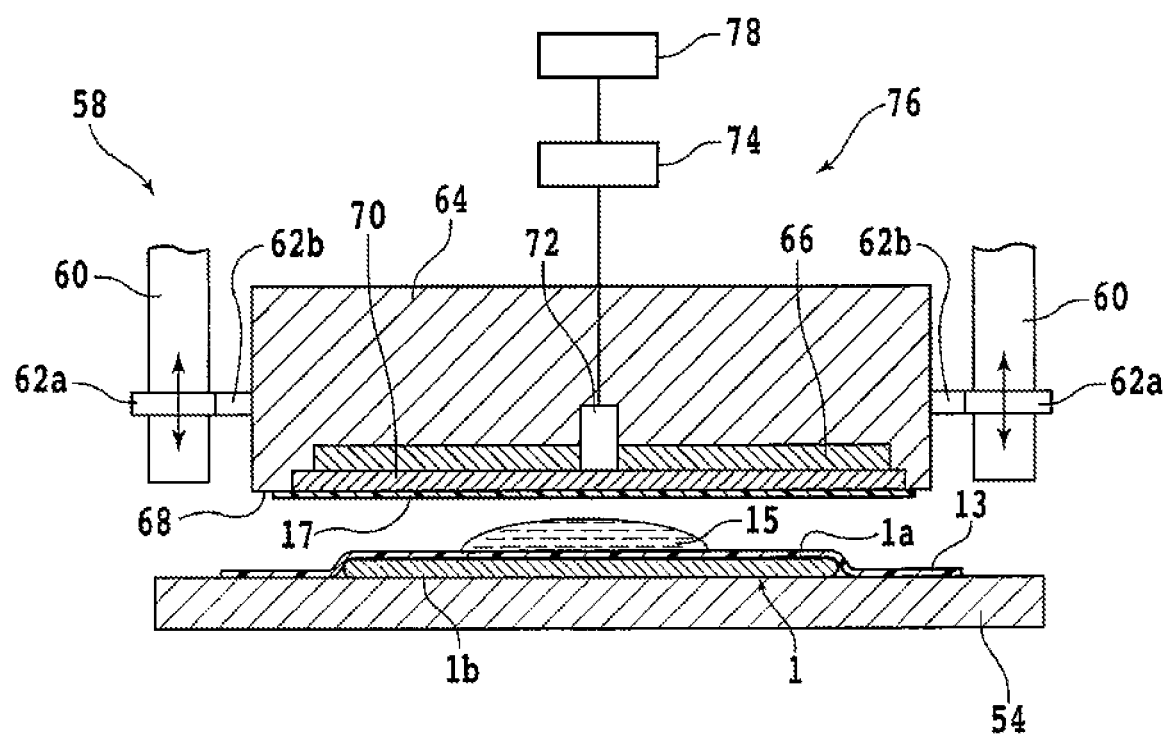
FIG. 6 is a sectional view schematically illustrating a substrate to which a resin film adheres, a liquid resin, a pressing unit, and a determining unit.
Figure 7A:
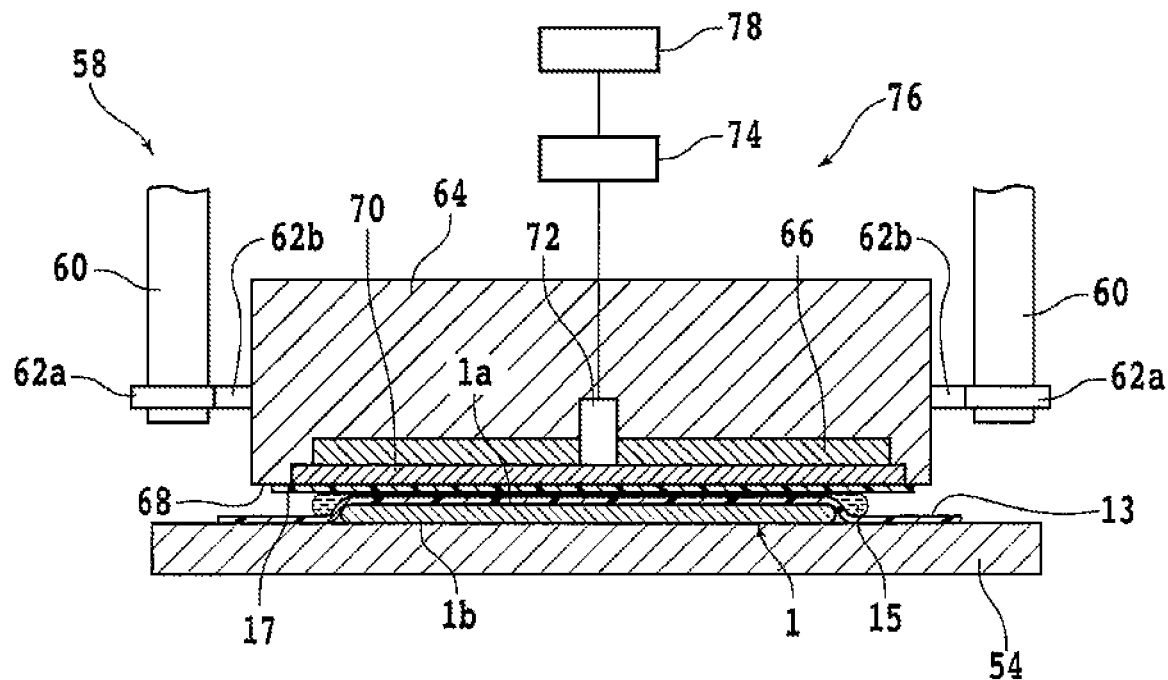
FIG. 7A is a sectional view schematically illustrating a state in which the liquid resin is pressed by the pressing unit.

A pressing unit 58 is disposed over the support table 54. FIG. 2 schematically illustrates a top view of the pressing unit 58. FIG. 6 and FIG. 7A schematically illustrate side views of the pressing unit 58. The pressing unit 58 includes: a pair of supporting columns 60 along the vertical direction; connecting portions 62a slidably arranged on the respective supporting columns 60; a pair of supporting portions 62b extending in the horizontal direction from the respective connecting portions 62a; and a pressing portion 64 supported by the pair of supporting portions 62b. The connecting portions 62a can be raised and lowered along the supporting columns 60 by a raising and lowering mechanism not illustrated. The pressing portion 64 can be raised and lowered by using the raising and lowering mechanism. The pressing portion 64 has a flat pressing surface 68 as a lower surface thereof. The direction of the pressing surface 68 is set with high accuracy such that the pressing surface 68 is parallel with the upper surface of the support table 54. The pressing portion 64 internally has an ultraviolet irradiating unit 66 in proximity to the pressing surface 68. The ultraviolet irradiating unit 66, for example, includes a plurality of ultraviolet light-emitting diodes (LEDs) annularly arranged next to each other in concentric layers. A flat plate-shaped light transmitting member 70 that transmits ultraviolet rays and visible light is used at a lower end of the pressing portion 64 which lower end constitutes the pressing surface 68.

The pressing portion 64 can hold a cover sheet 17 by the pressing surface 68. The pressing unit 58 lowers the pressing portion 64 in a state of holding the cover sheet 17 by the pressing surface 68 and presses the liquid resin 15 by the pressing surface 68 via the cover sheet 17 from above. When the liquid resin 15 is thereafter cured by the ultraviolet irradiating unit 66, the resin film 13, the cured liquid resin 15, and the cover sheet 17 are integrated with each other to form a protective member. That is, the cover sheet 17 is a member constituting the protective member.

As illustrated in FIG. 2, a cover sheet supply unit 80 that supplies the cover sheet 17 to be held by the pressing surface 68 of the pressing portion 64 is disposed at a position adjacent to the support table 54. For example, a plurality of cover sheets 17 are wound in a roll shape and prepared in the cover sheet supply unit 80 and are drawn out onto the support table 54 one by one as required. Then, the pressing surface 68 is brought into contact with the upper surface of a cover sheet 17 by lowering the pressing portion 64, and the cover sheet 17 is held by the pressing surface 68.

Here, the pressing portion 64 includes a holding mechanism not illustrated for holding the cover sheet 17 by the pressing surface 68. For example, the pressing surface 68 is provided with a plurality of suction holes connected to a suction source, and the cover sheet 17 is held by the pressing surface 68 by sucking the cover sheet 17 from the suction holes. Alternatively, the pressing portion 64 may have an electrostatic chuck mechanism in the vicinity of the pressing surface 68, and the electrostatic chuck mechanism may be actuated to hold the cover sheet 17 by the pressing surface 68 through an electrostatic force. Alternatively, the pressing portion 64 may have no holding mechanism. In this case, for example, a glue layer may be provided to the upper surface of the cover sheet 17, and the cover sheet 17 may be bonded to the pressing surface 68 by the glue layer. Alternatively, the upper surface of the cover sheet 17 or the pressing surface 68 may be coated with an adhesive, and the cover sheet 17 may be held by the pressing surface 68 through the adhesive.

Over the support table 54, after the liquid resin supply unit 56 supplies the liquid resin 15 onto the resin film 13, the pressing unit 58 holding the cover sheet 17 by the pressing surface 68 is lowered, and the pressing surface 68 presses the liquid resin 15 via the cover sheet 17. FIG. 7A schematically illustrates a sectional view of the substrate 1, the resin film 13, the liquid resin 15, and the cover sheet 17 when the liquid resin 15 is pressed by the pressing surface 68. When the liquid resin 15 is pressed by the pressing surface 68, the liquid resin 15 is spread toward the outer circumference of the substrate 1. In other words, the pressing unit 58 has a function of spreading the liquid resin 15 over the resin film 13 by pressing the liquid resin 15 by the pressing surface 68 via the cover sheet 17 while covering an upper part of the liquid resin 15 supplied by the liquid resin supply unit 56 with the cover sheet 17.

Figure 7B:
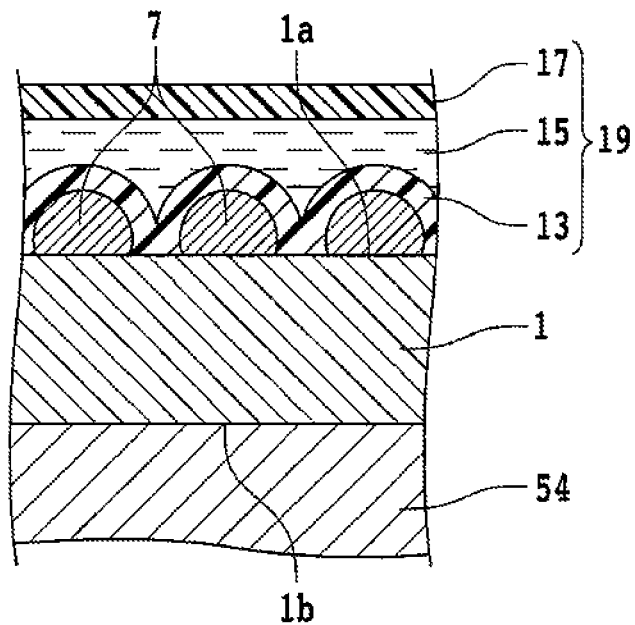
FIG. 7B is a sectional view schematically illustrating a protective member formed on the top surface of the substrate.

The ultraviolet irradiating unit 66 cures the liquid resin 15 after the liquid resin 15 is spread to an outer circumference 1c of the substrate 1 and a predetermined region of the top surface 1a of the substrate 1 is covered by the resin film 13, the liquid resin 15, and the cover sheet 17. At this time, the ultraviolet irradiating unit 66 irradiates the liquid resin 15 with ultraviolet rays through the pressing surface 68 and the cover sheet 17. Thereafter, when the ultraviolet irradiating unit 66 is stopped and the pressing portion 64 is raised, the cover sheet 17 is left on the cured liquid resin 15. That is, a protective member 19 in which the resin film 13, the cured liquid resin 15, and the cover sheet 17 are integrated with each other is formed on the top surface 1a of the substrate 1. Here, the undersurface 1b side of the substrate 1 and the upper surface of the protective member 19 become flat with each other because the upper surface of the support table 54 and the pressing surface 68 are flat with each other. FIG. 7B is a sectional view schematically illustrating, in enlarged dimension, the protective member 19 formed on the substrate 1 having projections and depressions due to the bumps 7 on the top surface 1a.

Conventionally, when the liquid resin 15 is spread by being pressed, the liquid resin 15 may not be sufficiently spread over a predetermined range, so that the liquid resin 15 may not reach an outer edge in the predetermined range, or nonuniformity may occur in the liquid resin 15. In this case, when the undersurface 1b side of the substrate 1 is ground after the protective member 19 is formed by curing the liquid resin 15 and the substrate 1 on which the protective member 19 is formed is thereafter transferred to the grinding apparatus, the substrate 1 is not properly supported by the protective member 19. Consequently, grinding nonuniformity may occur on the undersurface 1b side of the substrate 1, or the undersurface 1b may not be flat. Accordingly, the protective member forming apparatus 2 according to the present embodiment includes a determining unit 76 that determines the state of the liquid resin 15 spread by the pressing unit 58. The determining unit 76 detects the liquid resin 15 and determines whether or not the liquid resin 15 is properly spread over the predetermined range when the liquid resin 15 is spread by being pressed. The determining unit 76 is, for example, incorporated in the pressing unit 58. The determining unit 76 will next be described.

As illustrated in FIG. 6 and FIG. 7A, the determining unit 76 includes a camera 72 disposed in the center of the ultraviolet irradiating unit 66 of the pressing portion 64. The camera 72 photographs the liquid resin 15 and the substrate 1 from above through the pressing surface 68 of the pressing unit 58. More specifically, the camera 72 photographs the substrate 1 and the liquid resin 15 through the light transmitting member 70 constituting the pressing surface 68 and the cover sheet 17 held by the pressing surface 68. The camera 72 is desired to be able to photograph a region ranging to the outer circumference 1c of the substrate 1 in order to determine whether or not the liquid resin 15 is sufficiently spread over the substrate 1. When the light transmitting member 70 has a certain thickness, for example, the camera 72 can photograph a wide range. On the other hand, the light transmitting member 70 is desired to be sufficiently thin so as not to impair efficiency of irradiation of the liquid resin 15 with ultraviolet rays. Accordingly, a fisheye lens or a wide-angle lens is used as the camera 72, the fisheye lens or the wide-angle lens being disposed so as to be adjacent to the ultraviolet irradiating unit 66 and installed at a position corresponding to the center of the facing substrate 1.

A function desired to be performed by the camera 72 is to obtain an image that enables determination of the presence or absence of the liquid resin 15 over the entire area of the top surface 1a of the substrate 1, rather than obtaining an image without distortion. The use of a lens capable of photographing a wide area, such as a fisheye lens or a wide-angle lens, makes it possible to photograph the entire area of the top surface 1a of the substrate 1 by the camera 72 even when the light transmitting member 70 is sufficiently thin. In other words, when a fisheye lens or the like is used as the camera 72, the light transmitting member 70 can be made thin, and thus, efficiency of irradiation of the liquid resin 15 with ultraviolet rays can be improved.

Figure 8:
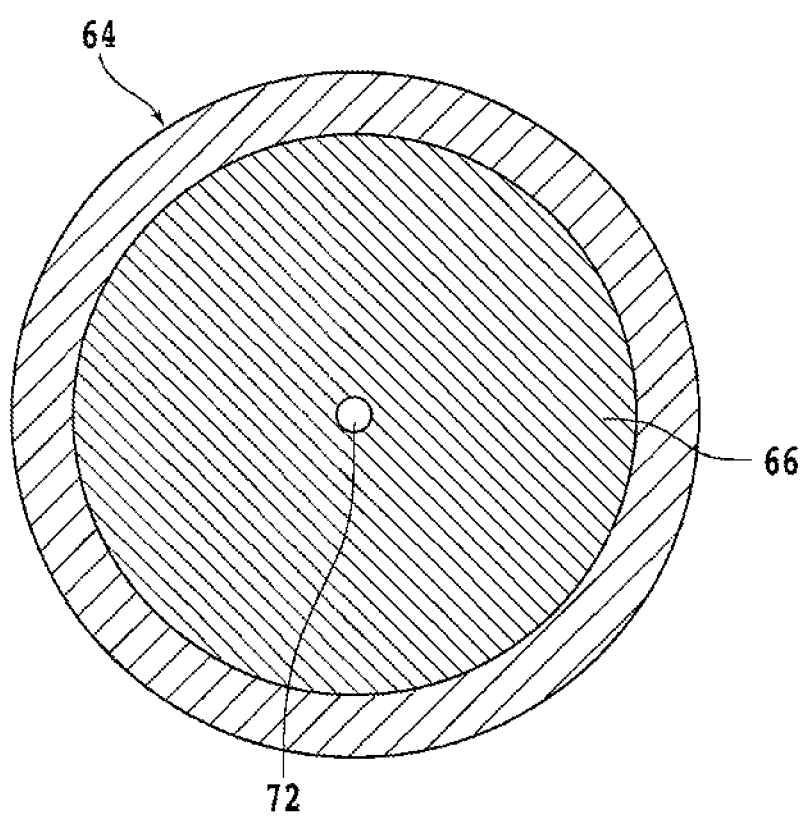
FIG. 8 is a sectional view schematically illustrating the pressing unit.

Here, FIG. 8 schematically illustrates a sectional view that can be observed when the pressing portion 64 of the pressing unit 58 is divided by a horizontal plane including the ultraviolet irradiating unit 66 and the camera 72. A plurality of cameras 72 may be provided within the pressing unit 58 in order to photograph the entire area of the top surface 1a of the substrate 1. In this case, however, an area occupied by the ultraviolet irradiating unit 66 needs to be reduced by an amount corresponding to areas in which the cameras 72 are installed. Then, the ultraviolet LEDs may not be able to be arranged sufficiently, and the irradiation of the liquid resin 15 with ultraviolet rays may not be able to be performed sufficiently without nonuniformity. As such, the use of a fisheye lens or the like can secure a sufficient area to be occupied by the ultraviolet irradiating unit 66 and does not cause such a problem. However, in the protective member forming apparatus 2 according to the present embodiment, in a case where the ultraviolet irradiating unit 66 has a sufficiently high power, the determining unit 76 may have a plurality of cameras 72, and a lens other than a fisheye lens or the like may be used as the cameras 72.

The determining unit 76 further includes a determining section 74 connected to the camera 72. The determining section 74 detects the liquid resin 15 and the substrate 1 from an image obtained by photographing by the camera 72 and determines whether or not the liquid resin 15 is spread over a predetermined range with respect to the substrate 1. Functions of the determining section 74 are, for example, implemented as software on an apparatus control computer that controls each constituent element of the protective member forming apparatus 2. Here, the apparatus control computer is constituted by a computer including a processing apparatus such as a central processing unit (CPU) and a storage apparatus such as a flash memory. Then, when the processing apparatus is operated according to software such as a program stored in the storage apparatus, the software and the processing apparatus (hardware resources) function as cooperating concrete means.

Figure 9A:
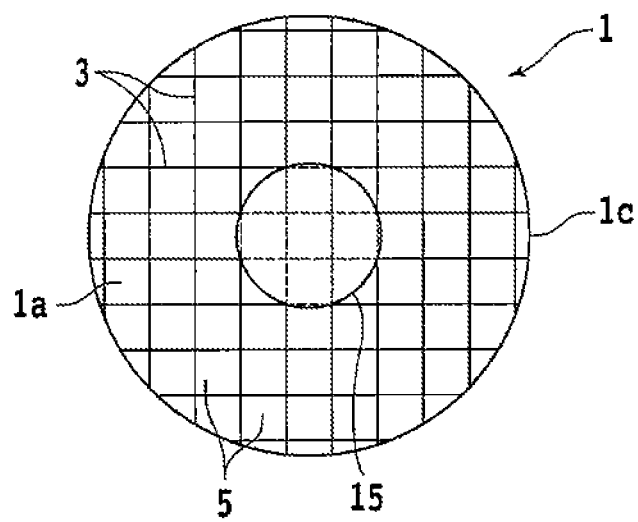
FIG. 9A is a plan view schematically illustrating the liquid resin supplied above the substrate.
Figure 9B:
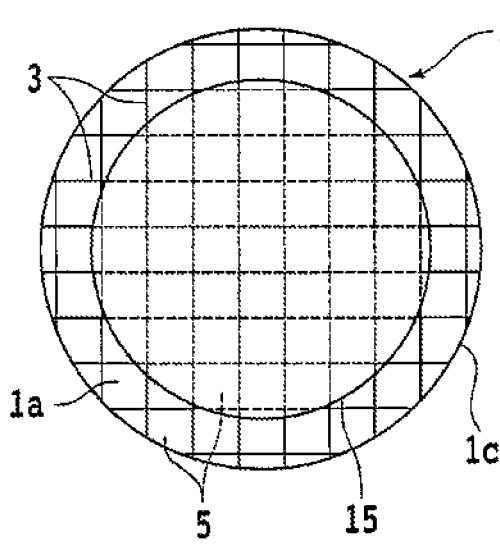
FIG. 9B is a plan view schematically illustrating the liquid resin being pressed.
Figure 9C:
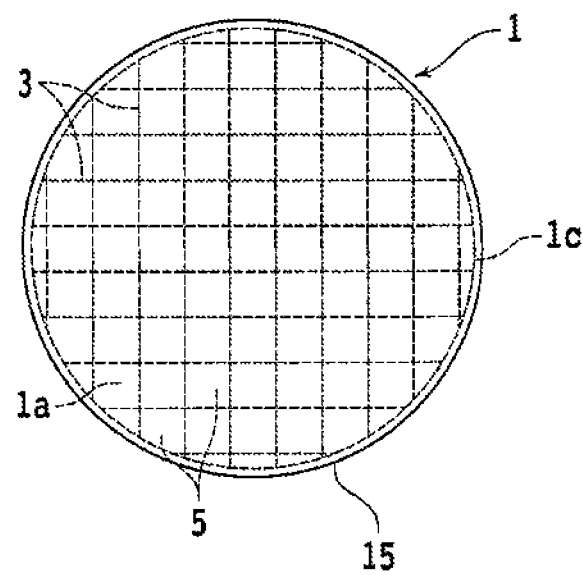
FIG. 9C is a plan view schematically illustrating the liquid resin being further pressed.

Determination made by the determining section 74 will next be described. The determining section 74 makes determination on the basis of an image obtained by photographing by the camera 72. The camera 72, for example, photographs the substrate 1 and the liquid resin 15 and obtains an image periodically while the pressing unit 58 presses the liquid resin 15. FIGS. 9A to 9C each illustrate an example of an image obtained by photographing by the camera 72. Incidentally, the resin film 13 is omitted in each figure. The substrate 1 and the liquid resin 15 appear in the images obtained by photographing by the camera 72. In FIGS. 9A to 9C, for the convenience of description, devices 5 and the like formed on the top surface 1a of the substrate 1, the devices 5 and the like appearing in the images through the liquid resin 15, are indicated by broken lines. FIG. 9A is a diagram schematically illustrating an image obtained when the liquid resin 15 is supplied above the substrate 1.

When the liquid resin 15 is pressed by the pressing surface 68 by lowering the pressing portion 64, the liquid resin 15 is spread toward the outer circumference 1c of the substrate 1. FIG. 9B is a diagram schematically illustrating an image obtained in a state in which the liquid resin 15 is pressed and spread over a certain range. When the pressing portion 64 is further lowered, the liquid resin 15 is spread beyond the outer circumference 1c of the substrate 1. FIG. 9C is a diagram schematically illustrating an image obtained in a state in which the liquid resin 15 is sufficiently spread.

The determining section 74 detects the substrate 1 and the liquid resin 15 from the image obtained by photographing by the camera 72. The determining section 74 then determines whether or not the liquid resin 15 is spread over a predetermined range with respect to the substrate 1. The predetermined range is a range over which the liquid resin 15 can be determined to be spread to such an extent that the formed protective member 19 can sufficiently protect the top surface 1a of the substrate 1 and desired grinding can be performed on the undersurface 1b of the substrate 1. An outer edge of the predetermined range is determined with respect to the substrate 1, and is, for example, set so as to coincide with the outer circumference 1c of the substrate 1. Then, the determining section 74 determines whether or not the liquid resin 15 is spread over the predetermined range. When the camera 72 photographs the substrate 1 and the liquid resin 15 and obtains an image as illustrated in FIG. 9B, the determining section 74 determines that the liquid resin 15 is not spread over the predetermined range. In addition, when the liquid resin 15 is further spread and the camera 72 photographs the substrate 1 and the liquid resin 15 and obtains an image as illustrated in FIG. 9C, the determining section 74 determines that the liquid resin 15 is spread over the predetermined range.

The determining unit 76 includes a notifying section 78 that gives a notification regarding a determination result of the determining section 74 to a user, a manager, or the like of the protective member forming apparatus 2. When the determining section 74 determines that the liquid resin 15 is not spread over the predetermined range, for example, the notifying section 78 gives a notification regarding the determination result to the user, the manager, or the like of the protective member forming apparatus 2. The notifying section 78 is, for example, a display unit, an alarm lamp, or the like provided to the exterior of the protective member forming apparatus 2. The notifying section 78 gives a notification regarding the determination result by displaying a warning screen on the display unit or lighting a red light of the alarm lamp.

Notified of the determination result of the determining section 74 from the notifying section 78, the user, the manager, or the like, for example, makes the pressing unit 58 further spread the liquid resin 15 by further proceeding with the pressing of the liquid resin 15. In addition, the amount of supply of the liquid resin supplied by the liquid resin supply unit 56 is increased so that the liquid resin 15 is spread over a wider region of a next and subsequent substrates 1 on which the protective member 19 is to be formed. On the other hand, when the determining section 74 determines that the liquid resin 15 is spread over the predetermined range, the display unit functioning as the notifying section 78 continues displaying an image illustrating that the protective member forming apparatus 2 is operating normally. Alternatively, a green light of the alarm lamp functioning as the notifying section 78 continues to be lit. That is, the notification of the determination result of the determining section 74 by the notifying section 78 includes non-notification of the occurrence of an abnormality by the notifying section 78.

As described above, in the protective member forming apparatus 2 according to the present embodiment, the determining unit 76 determines whether or not the liquid resin 15 is sufficiently spread over the predetermined range with respect to the substrate 1. Therefore, when the liquid resin 15 is not spread over the predetermined range, the liquid resin 15 can be spread by further being pressed by the pressing unit 58 before the ultraviolet irradiating unit 66 is actuated. As a result, the protective member 19 can be formed on the substrate 1 properly, and thus, the undersurface 1b of the substrate 1 can be ground by the grinding apparatus properly. Incidentally, the determining unit 76 may obtain information regarding the state of the liquid resin 15 from the image obtained by photographing by the camera 72 and determine whether or not nonuniformity occurs in the liquid resin 15. When it is determined that nonuniformity occurs in the liquid resin 15, the pressing unit 58 may similarly further press the liquid resin 15, and a measure of increasing the amount of supply of the liquid resin 15 or the like may be carried out.

Figure 10:
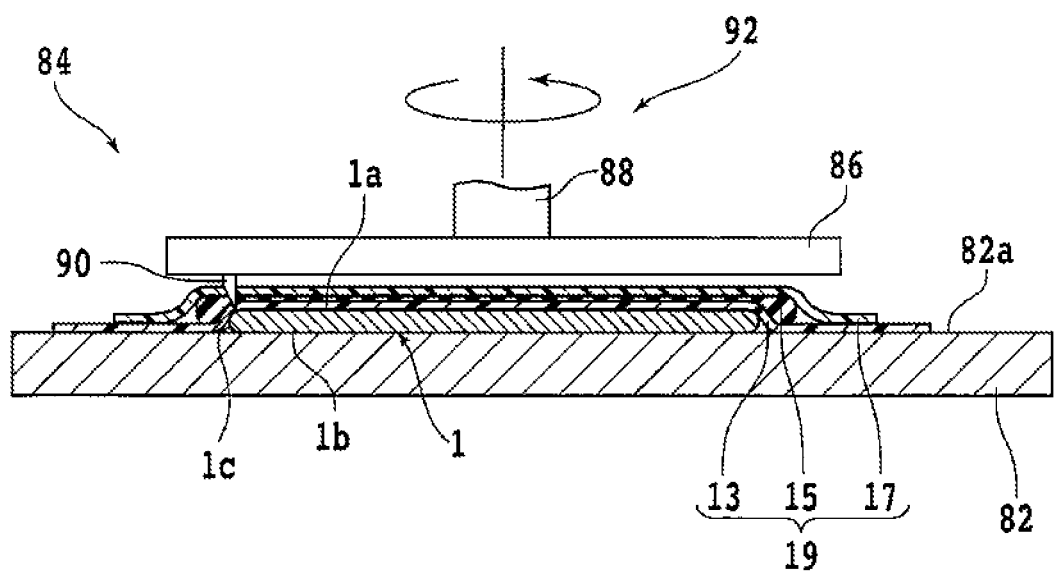
FIG. 10 is a sectional view schematically illustrating a state in which the protective member formed on the top surface of the substrate is cut along the outer circumference of the substrate.

The protective member forming apparatus 2 includes a cutting unit 84 (see FIG. 10) that cuts off an unnecessary part of the protective member 19 formed on the top surface 1a of the substrate 1. The cutting of the protective member 19 by the cutting unit 84 is performed on a table 82 provided at a position adjacent to the support table 54 on the base 4. The protective member forming apparatus 2 includes a transfer unit 24b that can transfer the substrate 1 on which the protective member 19 is formed from the support table 54 to the table 82. Incidentally, the transfer unit 24b is formed in a similar manner to the transfer unit 24a, and therefore, description thereof will be partially omitted.

FIG. 2 schematically illustrates a top view of the transfer unit 24b. The transfer unit 24b includes a guide rail 26b along a direction in which the support table 54 and the table 82 are arranged and an arm portion 28b slidably fitted to the guide rail 26b. The transfer unit 24b includes a moving mechanism (not illustrated) that moves the arm portion 28b and a base portion 30b along the guide rail 26b. The base portion 30b is fixed to a distal end side of the arm portion 28b. A plate-shaped noncontact type suction pad supporting portion 40b is fixed to the central lower surface of the base portion 30b via a plurality of columnar supporting portions. A through hole 44b is formed in the noncontact type suction pad supporting portion 40b. A plurality of noncontact type suction pads are provided to the lower surface of the noncontact type suction pad supporting portion 40b. In addition, a plurality of suction pads are fixed to the lower surface of an outer circumferential portion of the base portion 30b.

When the transfer unit 24b transfers the substrate 1 provided with the protective member 19, the base portion 30b is moved to a position above the support table 54. Then, the base portion 30b is lowered to suck and hold the resin film 13 by the suction pads and suck and hold the protective member 19 by the noncontact type suction pads. Thereafter, the base portion 30b is raised, the base portion 30b is moved to a position above the table 82, and the base portion 30b is lowered to place the substrate 1 on which the protective member 19 is formed onto the table 82. Thereafter, first, the suction of the resin film 13 is released. Next, the sucking and holding of the protective member 19 is released. In this case, the substrate 1 is placed on the table 82 in a state in which the resin film 13 is spread over the table 82 due to a flow of gas jetted from the noncontact type suction pads. While the noncontact type suction pads suck the resin film 13, the flow of the gas from the noncontact type suction pads cools the protective member 19 and increases hardness of the protective member 19. It is therefore easy to cut off the unnecessary part of the protective member 19.

Incidentally, the table 82 may have a holding mechanism that can suck and hold the substrate 1. In this case, the upper surface of the table 82 is a holding surface 82a. The table 82 is, for example, a chuck table that includes a porous member exposed on the holding surface 82a and a suction source connected to the porous member, and sucks and holds the substrate 1 placed on the holding surface 82a by actuating the suction source.

The cutting unit 84 will next be described. The cutting unit 84 includes the table 82 that supports the substrate 1 having the protective member 19 formed on the top surface 1a. The cutting unit 84 further includes: a rotary shaft 88 along a direction perpendicular to the holding surface 82a of the table 82; a disk-shaped cutting portion supporting portion 86 fixed to a lower end of the rotary shaft 88; and a cutting portion 90 fixed to an outer circumferential side of the lower surface of the cutting portion supporting portion 86. The cutting portion 90 is, for example, a cutter having a sharp lower edge. A rotation driving source not illustrated is connected to an upper end of the rotary shaft 88. When the rotation driving source is actuated to rotate the rotary shaft 88, the cutting portion 90 fixed to the lower surface of the cutting portion supporting portion 86 moves in an annular orbit along the outer circumference 1c of the substrate 1. That is, the rotation driving source, the rotary shaft 88, and the cutting portion supporting portion 86 function as a cutting portion moving unit 92 that moves the cutting portion 90.

When the cutting unit 84 cuts the protective member 19, the cutting unit 84 lowers the rotary shaft 88 while revolving and moving the cutting portion 90 by actuating the cutting portion moving unit 92, thereby making the cutting portion 90 cut in along the protective member 19. That is, the cutting unit 84 can cut the protective member 19 along the outer circumference 1c of the substrate 1 by moving the cutting portion 90 along the outer circumference 1c of the substrate 1 by the cutting portion moving unit 92. After the cutting unit 84 cuts off the unnecessary part of the protective member 19, grinding of the substrate 1 becomes possible. An unnecessary part collecting unit 94 that collects the cut-off unnecessary part of the protective member 19 is provided at a position adjacent to the table 82 on the base 4. For example, the unnecessary part of the protective member 19 is transferred to the unnecessary part collecting unit 94 by the transfer unit 24b, the unnecessary part is dropped onto the unnecessary part collecting unit 94 by releasing the suction of the unnecessary part, and the unnecessary part is sucked and collected. After the cutting unit 84 cuts off the unnecessary part of the protective member 19, the substrate transfer robot 10b carries out the substrate 1 having the protective member 19 formed on the top surface 1a from the table 82, and houses the substrate 1 having the protective member 19 formed on the top surface 1a into the cassette 8b mounted on the cassette mounting base 6b. Thereafter, the cassette 8b is transferred to the grinding apparatus, and the grinding apparatus grinds the substrate 1 from the undersurface 1b side.

Figure 11:
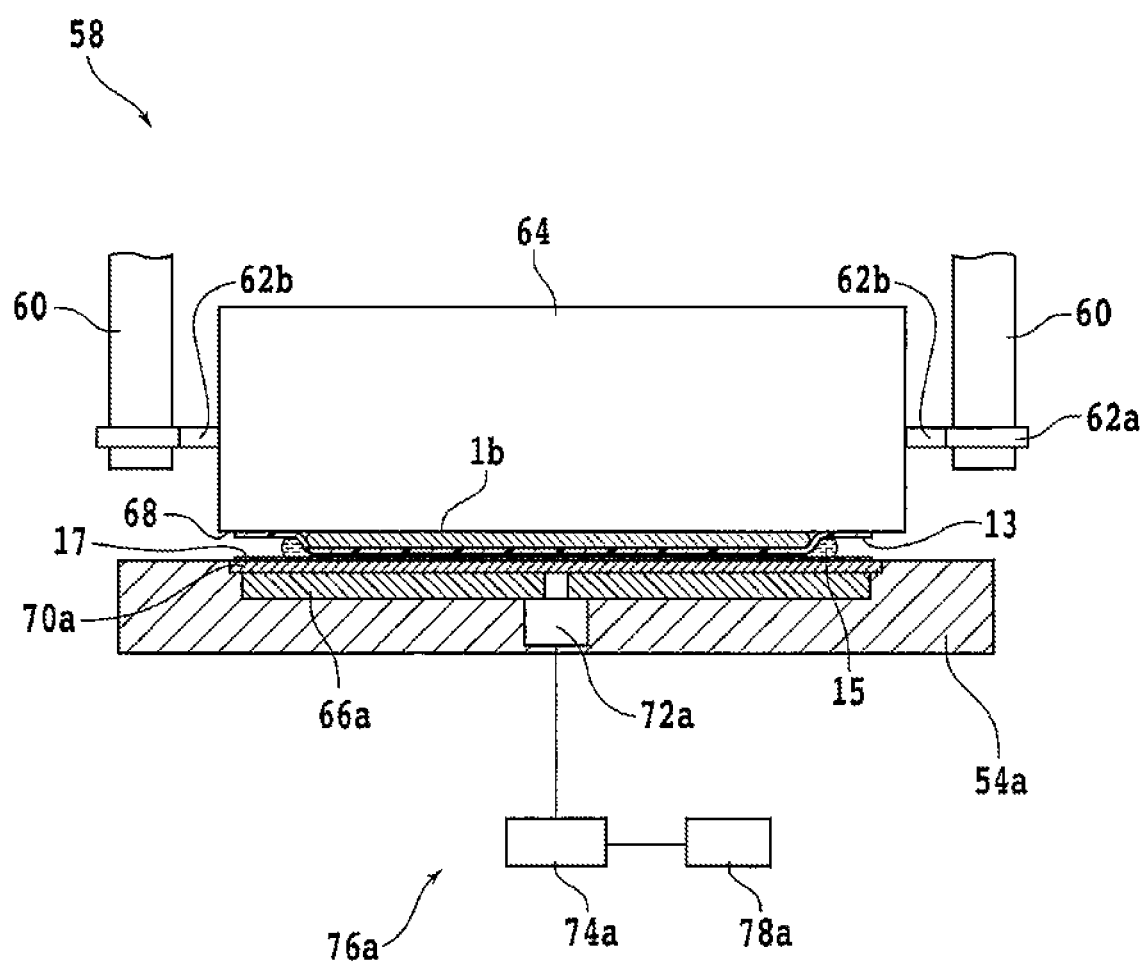
FIG. 11 is a sectional view schematically illustrating a determining unit according to a modification.

It is to be noted that the present invention is not limited to the description of the foregoing embodiment and can be modified and carried out in various manners. For example, while in the foregoing embodiment, description has been made of a case where the liquid resin 15 is supplied to the top surface 1a of the substrate 1 from above and the liquid resin 15 is pressed from above via the cover sheet 17, the protective member forming apparatus 2 according to one aspect of the present invention is not limited to this. Specifically, the protective member forming apparatus 2 may supply the liquid resin 15 onto the cover sheet 17 and spread the liquid resin 15 by pressing the liquid resin 15 from above by the substrate 1 to which the resin film 13 adheres. A modification of the protective member forming apparatus 2 will next be described with reference to FIG. 11. In the modification, the supporting surface of a support table 54a is formed by a light transmitting member 70a, and the support table 54a is able to support the cover sheet 17 by the supporting surface. Then, the liquid resin supply unit 56 supplies the liquid resin 15 to the upper surface of the cover sheet 17 supported on the support table 54a.

The pressing unit 58 disposed above the support table 54a can hold the substrate 1 by the pressing surface 68 in a state in which the top surface 1a of the substrate 1 to which the resin film 13 adheres is directed downward. The substrate 1 in the state in which the top surface 1a to which the resin film 13 adheres is directed downward is pressed from above by the flat pressing surface 68 so that the resin film 13 adheres to the liquid resin 15 on the cover sheet 17 supported on the support table 54a. Then, the liquid resin 15 is pressed and spread via the resin film 13. An ultraviolet irradiating unit 66a that cures the liquid resin 15 by irradiating the liquid resin 15 with ultraviolet rays through the supporting surface of the support table 54a and the cover sheet 17 is incorporated in an upper portion of the support table 54a.

When the ultraviolet irradiating unit 66a is actuated and the liquid resin 15 is cured, the protective member 19 including the resin film 13, the cured liquid resin 15, and the cover sheet 17 is formed on the top surface 1a of the substrate 1.

Also in the present modification, the protective member 19 cannot be formed properly when the liquid resin 15 is not sufficiently spread over the predetermined range. Accordingly, a determining unit 76a is used. The determining unit 76a has a function of determining the state of the liquid resin 15 spread by the pressing unit 58. The determining unit 76a is formed in a similar manner to the determining unit 76 in the foregoing embodiment. The determining unit 76a includes: a camera 72a that photographs the liquid resin 15 and the substrate 1 from below through the supporting surface of the support table 54a; and a determining section 74a that determines whether or not the liquid resin 15 is spread over the predetermined range on the basis of an image photographed by the camera 72a. The determining unit 76a further includes a notifying section 78a that gives a notification regarding a result of the determination by the determining section 74a.

Also in the present modification, the determining unit 76a can determine whether or not the liquid resin 15 is spread over the predetermined range with respect to the substrate 1 before the ultraviolet irradiating unit 66a cures the liquid resin 15. The liquid resin 15 is therefore cured after it is confirmed that the liquid resin 15 is spread over the predetermined range. Thus, the protective member 19 is formed on the top surface 1a of the substrate 1 properly.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member forming apparatus for forming a protective member on a top surface of a substrate having projections and depressions on the top surface, the protective member being flatter than the projections and depressions on the top surface, by laminating a liquid resin of an ultraviolet curing type and a cover sheet on a resin film adhering to the top surface of the substrate so as to conform to the projections and depressions, the resin film being larger than the substrate, the protective member forming apparatus comprising:
   a support table configured to support the substrate having the resin film adhering to the top surface;
   a liquid resin supply unit configured to supply the liquid resin onto the resin film adhering to the substrate supported on the support table;
   a pressing unit including a pressing surface capable of holding the cover sheet, the pressing surface being flat and having a light transmitting property, the pressing unit being configured to spread the liquid resin over the resin film by pressing the liquid resin supplied onto the resin film by the pressing surface via the cover sheet held by the pressing surface;
   an ultraviolet irradiating unit configured to cure the liquid resin by irradiating the liquid resin with ultraviolet rays through the pressing surface and the cover sheet and form the protective member including the resin film, the cured liquid resin, and the cover sheet; and
   a determining unit configured to determine a state of the liquid resin spread by the pressing unit,
   the determining unit including
      a camera configured to photograph the liquid resin and the substrate from above through the pressing surface of the pressing unit,
      a determining section configured to detect the liquid resin and the substrate from an image obtained by photographing by the camera and determine whether or not the liquid resin is spread over a predetermined range with respect to the substrate, and
      a notifying section configured to give a notification regarding a determination result of the determining section.

2. The protective member forming apparatus according to claim 1, wherein
   the camera has a fisheye lens or a wide-angle lens disposed so as to be adjacent to the ultraviolet irradiating unit and installed at a position corresponding to a center of the facing substrate, and the photographing is performed by using the fisheye lens or the wide-angle lens.

3. A protective member forming apparatus for forming a protective member on a top surface of a substrate having projections and depressions on the top surface, the protective member being flatter than the projections and depressions on the top surface, by laminating a liquid resin of an ultraviolet curing type and a cover sheet on a resin film adhering to the top surface of the substrate so as to conform to the projections and depressions, the resin film being larger than the substrate, the protective member forming apparatus comprising:
   a support table having a supporting surface formed by a light transmitting member, the support table being capable of supporting the cover sheet by the supporting surface;
   a liquid resin supply unit configured to supply the liquid resin to an upper surface of the cover sheet supported on the support table;
   a pressing unit configured to press the substrate in a state in which the top surface to which the resin film adheres is directed downward, by a flat pressing surface from above to spread the liquid resin over the resin film such that the resin film adheres to the liquid resin on the cover sheet supported on the support table;
   an ultraviolet irradiating unit configured to cure the liquid resin by irradiating the liquid resin with ultraviolet rays through the supporting surface of the support table and the cover sheet and form the protective member including the resin film, the cured liquid resin, and the cover sheet; and
   a determining unit configured to determine a state of the liquid resin spread by the pressing unit;
   the determining unit including
      a camera configured to photograph the liquid resin and the substrate from below through the supporting surface of the support table,
      a determining section configured to detect the substrate and the liquid resin from an image obtained by photographing by the camera and determine whether or not the liquid resin is spread over a predetermined range with respect to the substrate, and
      a notifying section configured to give a notification regarding a determination result of the determining section.

4. The protective member forming apparatus according to claim 3, wherein
   the camera has a fisheye lens or a wide-angle lens disposed so as to be adjacent to the ultraviolet irradiating unit and installed at a position corresponding to a center of the facing substrate, and the photographing is performed by using the fisheye lens or the wide-angle lens.

\* \* \* \* \*